US012683568B2

(12) United States Patent
Cargouet et al.

(10) Patent No.: US 12,683,568 B2
(45) Date of Patent: Jul. 14, 2026

(54) PROGRAMMABLE GAIN AMPLIFIER

(71) Applicant: NXP USA, INC., Austin, TX (US)

(72) Inventors: Yann Cargouet, Portet sur Garonne (FR); Guillaume Mouret, Portet-sur-Garonne (FR)

(73) Assignee: NXP USA, Inc., Austin, TX (US)

(*) Notice: Subject to any disclaimer, the term of this patent is extended or adjusted under 35 U.S.C. 154(b) by 520 days.

(21) Appl. No.: 18/464,551

(22) Filed: Sep. 11, 2023

(65) Prior Publication Data

US 2024/0106403 A1 Mar. 28, 2024

(30) Foreign Application Priority Data

Sep. 15, 2022 (EP) .................................... 22306353

(51) Int. Cl.
*H03G 1/00* (2006.01)
*H03F 1/26* (2006.01)
*H03F 3/45* (2006.01)

(52) U.S. Cl.
CPC ............. *H03G 1/0088* (2013.01); *H03F 1/26* (2013.01); *H03F 3/45183* (2013.01); *H03F 3/45273* (2013.01)

(58) Field of Classification Search
CPC .... H03G 1/0088; H03G 3/001; H03G 1/0029; H03F 1/26; H03F 3/45183;
(Continued)

(56) References Cited

U.S. PATENT DOCUMENTS 5,606,277 A * 2/1997 Feliz ...................... H03F 3/087 250/214 C
5,999,052 A 12/1999 Tang
(Continued)

FOREIGN PATENT DOCUMENTS

WO 02097979 A2 12/2002

OTHER PUBLICATIONS

Savoj, J., "A Low-Power 0.5-6.6 GB/s Wireline Transceiver Embedded in Low-Cost 28 nm FPGAs", IEEE Journal of Solid-State Circuits, vol. 48, No. 11, Nov. 2013.

*Primary Examiner* — Andrea Lindgren Baltzell
*Assistant Examiner* — Jose E Pinero

(57) ABSTRACT

A programmable gain amplifier that comprises: a transconductance amplifier, a switch leakage compensation circuit and a transimpedance amplifier. The transconductance amplifier provides a transconductance amplifier current signal and includes a switchable resistance network. The switch leakage compensation circuit provides a compensation current signal and comprises a switchable compensation resistance network. The transimpedance amplifier provides the output voltage signal based on the difference between the transconductance amplifier current signal and the compensation current signal. The switchable compensation resistance network comprises a plurality of branches in parallel with each other, wherein each branch includes: a gain-mimicking switch that has a corresponding gain-setting switch in the switchable resistance network; and a leakage-current-conducting switch in series with the gain-mimicking switch. The leakage-current-conducting switch is openable and closable in accordance with the complement of a switch control signal that is used to control the gain-mimicking switch in the same branch.

20 Claims, 6 Drawing Sheets

(58) Field of Classification Search
CPC ............... H03F 3/45273; H03F 1/3211; H03F 2200/453; H03F 2203/45091; H03F 2203/45094; H03F 2203/45352; H03F 2203/45366; H03F 2203/45492; H03F 2203/45504; H03F 3/45206; H03F 1/301; H03F 1/3205
USPC .......................................................... 330/254
See application file for complete search history.

(56) References Cited

U.S. PATENT DOCUMENTS

| | | | | |
|---|---|---|---|---|
| 6,549,075 | B1 | 4/2003 | Zhang | |
| 9,729,117 | B2 | 8/2017 | Reddy | |
| 11,435,488 | B2 * | 9/2022 | Steadman Booker . | A61B 6/032 |
| 2002/0175758 | A1 * | 11/2002 | Cyrusian ............. | H03F 3/45197 330/254 |
| 2005/0077972 | A1 * | 4/2005 | Oehm .................... | H03B 5/129 331/36 C |
| 2006/0001491 | A1 | 1/2006 | Barou et al. | |
| 2013/0314158 | A1 | 11/2013 | Koba et al. | |
| 2017/0010171 | A1 * | 1/2017 | Blouch ................... | G01L 21/32 |

* cited by examiner 100
101
102
103
104
105
106
107
108
109a
109b
116
117
transimpedance amplifier
transconductance amplifier
I AB
-I AB 200
201
202
203
204
205
206
207
208
210
211
212
213
214
215
216
217
218
219
220
221
222
223
224
230
231
232
233
switch leakage compensation
transimpedance amplifier
transconductance amplifier
Vin
Vout 300
301
307
311
313
Vin
Vshift
Vout
Voutp
Voutm
Ioutp
Ioutm
48Ru

PROGRAMMABLE GAIN AMPLIFIER

CROSS-REFERENCE TO RELATED APPLICATIONS

This application claims the priority under 35 U.S.C. § 119 of European Patent application no. 22306353.8, filed on 15 Sep. 2022, the contents of which are incorporated by reference herein.

FIELD

The present disclosure relates to a programmable gain amplifier (PGA).

SUMMARY

According to a first aspect of the present disclosure there is provided A programmable gain amplifier that is configured to receive an input voltage signal and provide an output voltage signal, wherein the programmable gain amplifier comprises:

- a transconductance amplifier, which is configured to receive the input voltage signal and provide a transconductance amplifier current signal, wherein the transconductance amplifier comprises a switchable resistance network that is configurable to set the gain of the programmable gain amplifier;
- a switch leakage compensation circuit, which is configured to receive the input voltage signal and output a compensation current signal, wherein the switch leakage compensation circuit comprises a compensation transconductance amplifier, and wherein the compensation transconductance amplifier comprises a switchable compensation resistance network;
- a transimpedance amplifier, which is configured to provide the output voltage signal based on the difference between the transconductance amplifier current signal from the transconductance amplifier and the compensation current signal from the switch leakage compensation circuit;

wherein:

- the switchable resistance network comprises a plurality of branches in parallel with each other, wherein each branch includes:
  - a gain-setting switch that is openable and closable in accordance with a switch control signal to influence the gain of the programmable gain amplifier; and
  - a resistance in series with the gain-setting switch;
- the switchable compensation resistance network comprises a plurality of branches in parallel with each other, wherein each branch includes:
  - a gain-mimicking switch that has a corresponding gain-setting switch in the switchable resistance network, wherein the gain-mimicking switch is openable and closable in accordance with the same switch control signal that is used for the corresponding gain-setting switch; and
  - a leakage-current-conducting switch in series with the gain-mimicking switch, wherein the leakage-current-conducting switch is openable and closable in accordance with the complement of the switch control signal that is used to control the gain-mimicking switch in the same branch.

In this way, when the gain-mimicking switch in the branch is open, the leakage-current-conducting switch in the branch is closed, and vice versa.

Advantageously, use of the switch leakage compensation circuit can improve the linearity of the programmable gain amplifier.

In one or more embodiments the gain-mimicking switches are configured to operate on the same bias conditions as their corresponding gain-setting switches.

In one or more embodiments each gain-mimicking switch is the same size as its corresponding gain-setting switch.

In one or more embodiments the transimpedance amplifier is configured to receive the transconductance amplifier current signal and the compensation current signal such that they have opposite polarities to each other.

In one or more embodiments the transconductance amplifier current signal is a differential signal that comprises: a positive differential transconductance amplifier current signal; and a negative differential transconductance amplifier current signal. The compensation current signal may be a differential signal that comprises: a positive differential compensation current signal; and a negative differential compensation current signal. The transimpedance amplifier may comprise a positive-input-terminal and a negative-input-terminal. The transconductance amplifier may comprise: a positive-output-terminal, which is configured to provide the positive differential transconductance amplifier current signal; and a negative-output-terminal, which is configured to provide the negative differential transconductance amplifier current signal. The switch leakage compensation circuit may comprise: a positive-output-terminal, which is configured to provide the positive differential compensation current signal; and a negative-output-terminal, which is configured to provide the negative differential compensation current signal. The positive-input-terminal of the transimpedance amplifier may be connected to the positive-output-terminal of the transconductance amplifier. The positive-input-terminal of the transimpedance amplifier may be connected to the negative-output-terminal of the switch leakage compensation circuit. The negative-input-terminal of the transimpedance amplifier may be connected to the negative-output-terminal of the transconductance amplifier. The negative-input-terminal of the transimpedance amplifier may be connected to the positive-output-terminal of the switch leakage compensation circuit.

In one or more embodiments the leakage-current-conducting-switches are smaller than the gain-mimicking switches.

In one or more embodiments the branches of the switchable compensation resistance network do not include any resistors.

In one or more embodiments a plurality of the branches in the switchable compensation resistance network comprise resistances with different resistance values.

In one or more embodiments the compensation transconductance amplifier is the same as the transconductance amplifier, with the exception of the switchable resistance network and the switchable compensation resistance network.

In one or more embodiments the circuit layout of the compensation transconductance amplifier is the same as the circuit layout of the transconductance amplifier.

In one or more embodiments, with the exception of the switchable resistance network and the switchable compensation resistance network, the component values of components in the compensation transconductance amplifier are the same as component values of corresponding components in the transconductance amplifier.

In one or more embodiments the switchable resistance network has a branch in which the gain-setting switch is always closed when the programmable gain array is in use in order to apply a minimum gain value.

In one or more embodiments the switchable resistance network has a branch that does not have a corresponding branch in the switchable compensation resistance network.

In one or more embodiments programmable gain amplifier further comprises a controller, where the controller is configured to provide switch control signals for operating the gain-setting switches, the gain-mimicking switches and the leakage-current-conducting switches such that the PGA applies a required gain value.

There is also disclosed an integrated circuit comprising any programmable gain amplifier disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

A programmable gain amplifier (PGA) can apply a gain value (also known as a gain factor) to an input voltage signal to provide an output voltage signal. The gain value that is applied by the PGA can be selected from a plurality (N) of gain values by controlling the states of a plurality of switches. To realize the functionality of the switches, MOSFETs (metal oxide semiconductor field effect transistors) can be used, which can have one of two states/positions: "open" and "closed". The PGA has N gain possibilities and can be implemented with N−1 switches that can be "opened" or "closed" depending on the required gain. However, when a MOSFET is used as a switch, it is not ideal. When the MOSFET is "open" there is a current leakage. This current leakage depends on the size of the MOSFET and can increase with temperature. This temperature dependence can be problematic in providing an accurate gain value.

Figure 1:
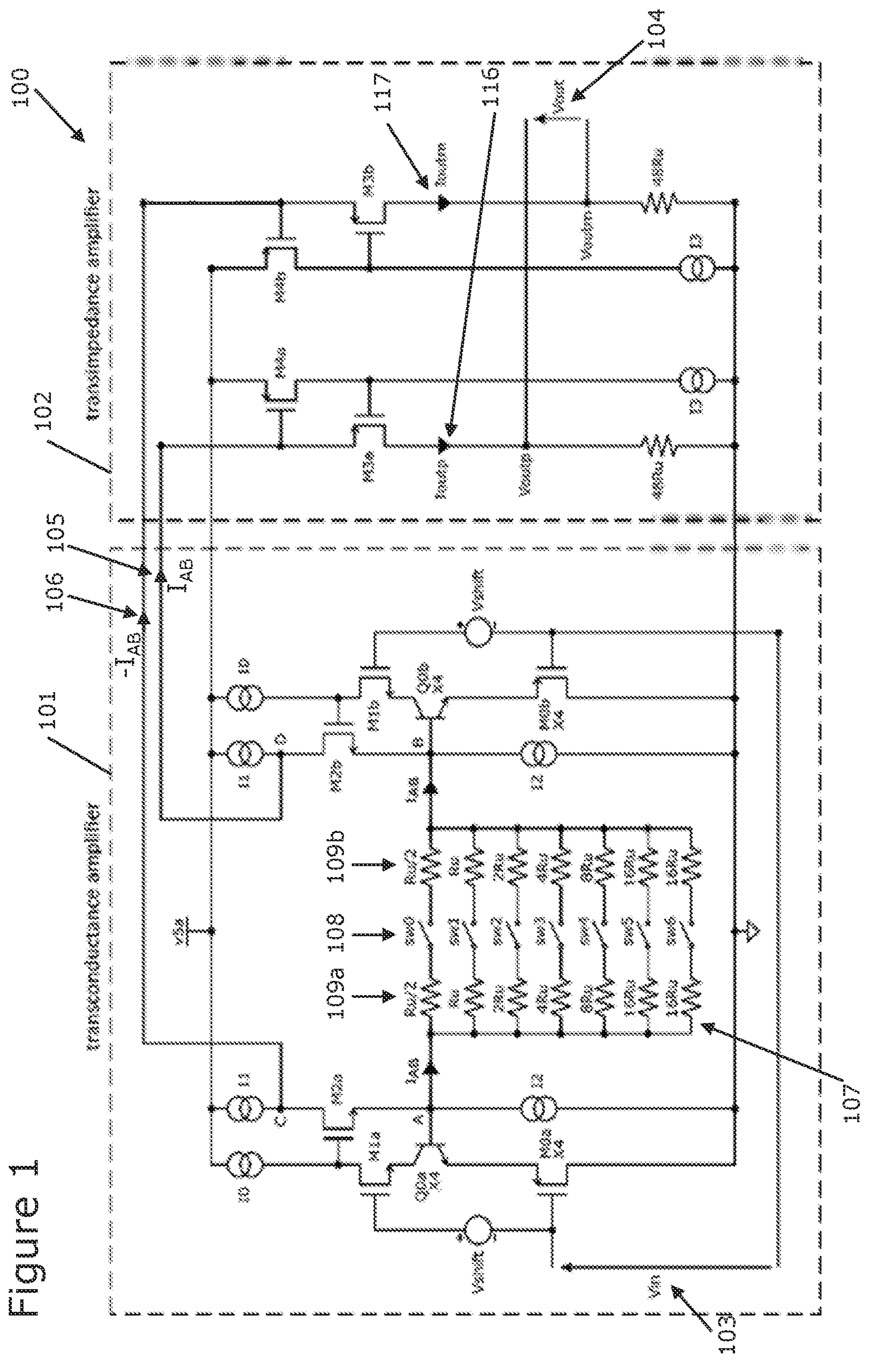
FIG. 1 shows an example of a programmable gain amplifier (PGA)

FIG. 1 shows an example of a programmable gain amplifier (PGA) 100. The PGA 100 receives an input voltage signal (Vin) 103 and provides an output voltage signal (Vout) 104.

The PGA 100 includes a transconductance amplifier 101 and a transimpedance amplifier 102. The transconductance amplifier 101 receives the input voltage signal (Vin) 103 and provides a transconductance amplifier current signal, in this example a differential transconductance amplifier current signal ($I_{AB}$, $-I_{AB}$) 105, 106. The transfer function of the transconductance amplifier 101 is Gm.

The transimpedance amplifier 102 provides the output voltage signal (Vout) 104 based on the differential transconductance amplifier current signal ($I_{AB}$, $-I_{AB}$) 105, 106 received from the transconductance amplifier 101. The transfer function of the transimpedance amplifier 102 is Zm. By combining the transfer functions of the transconductance amplifier 101 and the transimpedance amplifier 102 (Gm and Zm) we obtain the transfer function of the PGA:

$$Av = Gm \times Zm$$

The transconductance amplifier 101 includes a switchable resistance network 107, which comprises a plurality of gain-setting switches 108 that are configurable to set the gain of the PGA. As indicated above, the gain-setting switches 108 in the switchable resistance network 107 can be implemented as MOSFETs.

The switchable resistance network 107 of FIG. 1 has a plurality of branches in parallel with each other. Each branch is connected in series between the base of a first transistor (labelled as node A in FIG. 1) and the base of a second transistor (labelled as node B in FIG. 1). The first transistor and the second transistor are provided as part of a level shifter. Each branch of the switchable resistance network 107 includes a gain-setting switch 108 and a resistance 109*a*, 109*b*. The gain-setting switch 108 and the resistance 109*a*, 109*b* are in series with each other. In this example, the resistance in a branch is provided as a first resistor 109*a* and a second resistor 109*b* that have the same value. These resistors 109*a*, 109*b* are provided either side of the gain-setting switch 108—an arrangement that serves to reduce the common mode voltage of the switch—such that a single branch includes the following components:

- a first resistor 109*a* having a first terminal and a second terminal, wherein the first terminal of the first resistor 109*a* is connected to the base of the first transistor (node A);
- a second resistor 109*b* having a first terminal and a second terminal wherein the first terminal of the second resistor 109*b* is connected to the base of the second transistor (node B); and
- a gain-setting switch 108 that is connected between the second terminal of the first resistor 109*a* and the second terminal of the second resistor 109*b*.

The gain-setting switches 108 are openable and closable in accordance with a switch control signal to influence the gain of the programmable gain amplifier. In this example, the resistances in the branches do not have the same value such that a non-linear sequence of gain values is available. The resistance in each branch is expressed as a multiplier of a unit resistance (Ru). In this example: a first branch has a resistance value of Ru; a second branch has a resistance value of 2Ru; a third branch has a resistance value of 4Ru; a fourth branch has a resistance value of 8Ru; a fifth branch has a resistance value of 16Ru; a sixth branch has a resistance value of 32Ru; a seventh branch has a resistance value of 32Ru.

As will be discussed in detail below, when a gain-setting switch 108 is closed, the associated branch makes a contribution to the overall gain of the PGA 100. The size of the contribution of each branch depends on the value of the resistance in that branch.

The operation of the transconductance amplifier 101 can be represented by the following equations (assuming that the gain-setting switches 108 are ideal; that is they do not have any leakage current and they do not have any resistance when the switch is on/closed (i.e. on-resistance, $R_{ON}$)):

$$I_{outp} = I_{AB} = \frac{V_{in}}{R_u}\cdot b_0 + \frac{V_{in}}{2R_u}\cdot b_1 + \frac{V_{in}}{4R_u}\cdot b_2 + \frac{V_{in}}{8R_u}\cdot b_3 + \frac{V_{in}}{16R_u}\cdot b_4 + \frac{V_{in}}{32R_u}\cdot b_5 + \frac{V_{in}}{32R_u}\cdot b_6$$

$$I_{outm} = -I_{outp} = -I_{AB}$$

Where:

$I_{outp}$ 116 and $I_{outm}$ 117 are the differential input current signals for the transimpedance amplifier 102;

$I_{AB}$ 105 and $-I_{AB}$ 106 are the differential transconductance amplifier current signals that are provided as the output signals of the transconductance amplifier 101;

$V_{in}$ 103 is the input voltage;

$b_i$ is the switch control signal for setting the state of the $i^{th}$ gain-setting switch $sw_i$ ($b_i=0 \rightarrow sw_i$ open; and $b_i=1 \rightarrow sw_i$ closed); and $R_u$ is the unit resistance.

The overall transconductance amplifier current signal (I out) provided by the transconductance amplifier 101, which is a differential current signal in this example, can be written as:

$$I_{out}=I_{outp}-I_{outm}=2\cdot I_{AB}$$

The transfer function (Gm) of the transconductance amplifier 101 is:

$$G_m = \frac{I_{out}}{V_{in}} = \frac{2}{R_u}\cdot b_0 + \frac{1}{R_u}\cdot b_1 + \frac{1}{2R_u}\cdot b_2 + \frac{1}{4R_u}\cdot b_3 + \frac{1}{8R_u}\cdot b_4 + \frac{1}{16R_u}\cdot b_5 + \frac{1}{16R_u}\cdot b_6$$

The operation of the transimpedance amplifier 102 can be represented by the following equations:

$$V_{outp}=48R_u \times I_{outp}$$

$$V_{outm}=48R_u \times I_{outm}$$

$$V_{out}=V_{outp}-V_{outm}=48R_u\cdot(I_{outp}-I_{outm})$$

Where:

$V_{outp}$ is the voltage that is provided at a first voltage output terminal, based on a positive one of the differential input current signals ($I_{OUTP}$) 116 for the transimpedance amplifier 101;

$V_{outm}$ is the voltage that is provided at a second voltage output terminal, based on a negative one of the differential input current signals ($I_{OUTM}$) 117 for the transimpedance amplifier 101; and $V_{out}$ is the output voltage 104.

The transfer function (Zm) of the transimpedance amplifier 102 is:

$$Z_m = \frac{V_{out}}{I_{out}} = 48R_u$$

The overall transfer function (Av) of the PGA is:

$$A_V = G_m \times Z_m = \frac{I_{out}}{V_{in}}\cdot\frac{V_{out}}{I_{out}} = \frac{V_{out}}{V_{in}} = 96\cdot b_0 + 48\cdot b_1 + 24\cdot b_2 + 12\cdot b_3 + 6\cdot b_4 + 3\cdot b_5 + 3\cdot b_6$$

In this example, the switch control signals for the gain-setting switches 108 can take the following values in order to configure seven different gain values. Although it will be appreciated that different control signals (and indeed different resistance values in the branches of the switchable resistance network 107) can be used to provide different gain values.

| $b_0b_1b_2b_3b_4b_5b_6$ | $sw_0$ | $sw_1$ | $sw_2$ | $sw_3$ | $sw_4$ | $sw_5$ | $sw_6$ | $A_V$ |
|---|---|---|---|---|---|---|---|---|
| 0000001 | opened | opened | opened | opened | opened | opened | closed | 3 |
| 0000011 | opened | opened | opened | opened | opened | closed | closed | 6 |
| 0000111 | opened | opened | opened | opened | closed | closed | closed | 12 |
| 0001111 | opened | opened | opened | closed | closed | closed | closed | 24 |
| 0011111 | opened | opened | closed | closed | closed | closed | closed | 48 |
| 0111111 | opened | closed | closed | closed | closed | closed | closed | 96 |
| 1111111 | closed | closed | closed | closed | closed | closed | closed | 192 |

Examples of PGAs described herein can include a controller that provides the switch control signals for operating the switches such that the PGA 100 applies the required gain value to the input voltage signal (Vin) 103.

We will now rewrite some of the same previous equations, but include the leakage current of the gain-setting switches 108. This more accurately reflects the real-world operation of the gain-setting switches 108. The on-resistance, $R_{ON}$, will still be ignored, however, because it is so much smaller than the resistances 109*a*, 109*b* that are included in each branch such that it does not have a significant effect on the operation of the PGA 100.

The operation of the transconductance amplifier 101 can now be represented by the following equations (with the newly added terms in bold):

$$I_{outp} = I_{AB} = \frac{V_{in}}{R_u} \cdot b_0 + \frac{V_{in}}{2R_u} \cdot b_1 + \frac{V_{in}}{4R_u} \cdot b_2 + \frac{V_{in}}{8R_u} \cdot b_3 + \frac{V_{in}}{16R_u} \cdot b_4 + \frac{V_{in}}{32R_u} \cdot b_5 + \frac{V_{in}}{32R_u} \cdot b_6 + I_{sw0} \cdot \overline{b_0} + I_{sw1} \cdot \overline{b_1} + I_{sw2} \cdot \overline{b_2} + I_{sw3} \cdot \overline{b_3} + I_{sw4} \cdot \overline{b_4} + I_{sw5} \cdot \overline{b_5}$$

$$G_m = \frac{I_{out}}{V_{in}} = \frac{2}{R_u} \cdot b_0 + \frac{1}{R_u} \cdot b_1 + \frac{1}{2R_u} \cdot b_2 + \frac{1}{4R_u} \cdot b_3 + \frac{1}{8R_u} \cdot b_4 + \frac{1}{16R_u} \cdot b_5 + \frac{1}{16R_u} \cdot b_6 + \frac{2}{V_{in}}\left(I_{sw0} \cdot \overline{b_0} + I_{sw1} \cdot \overline{b_1} + I_{sw2} \cdot \overline{b_2} + I_{sw3} \cdot \overline{b_3} + I_{sw4} \cdot \overline{b_4} + I_{sw5} \cdot \overline{b_5}\right)$$

Where:

$I_{Swi}$ is the leakage current through the $i^{th}$ gain-setting switch 108; and $\overline{b}_i$ is the inverse of the switch control signal for setting the state of the $i^{th}$ gain-setting switch 108.

The overall transfer function (Av) of the PGA can then be represented as (again, with the newly added terms in bold):

$$A_V = G_m \times Z_m = \frac{V_{out}}{V_{in}} = 96 \cdot b_0 + 48 \cdot b_1 + 24 \cdot b_2 + 12 \cdot b_3 + 6 \cdot b_4 + 3 \cdot b_5 + 3 \cdot b_6 + \frac{96R_u}{V_{in}}\left(I_{sw0} \cdot \overline{b_0} + I_{sw1} \cdot \overline{b_1} + I_{sw2} \cdot \overline{b_2} + I_{sw3} \cdot \overline{b_3} + I_{sw4} \cdot \overline{b_4} + I_{sw5} \cdot \overline{b_5}\right)$$

This equation for the overall transfer function (Av) of the PGA shows a non-linearity term in bold; this is because the expression depends on Vin. This non-linearity term is problematic in that it can negatively affect the accuracy with which a desired gain value can be applied.

One or more of the embodiments of the present disclosure that follow can reduce or eliminate the non-linearity such that a more accurate gain value can be applied by the PGA. As will be discussed below, this can be achieved by duplicating part of the transconductance amplifier 101, especially by providing switches that correspond to at least some of the gain-setting switches 108, but without the resistances in the switchable resistance network 107 (such that it does not significantly contribute to the gain of the PGA 100).

Figure 2:
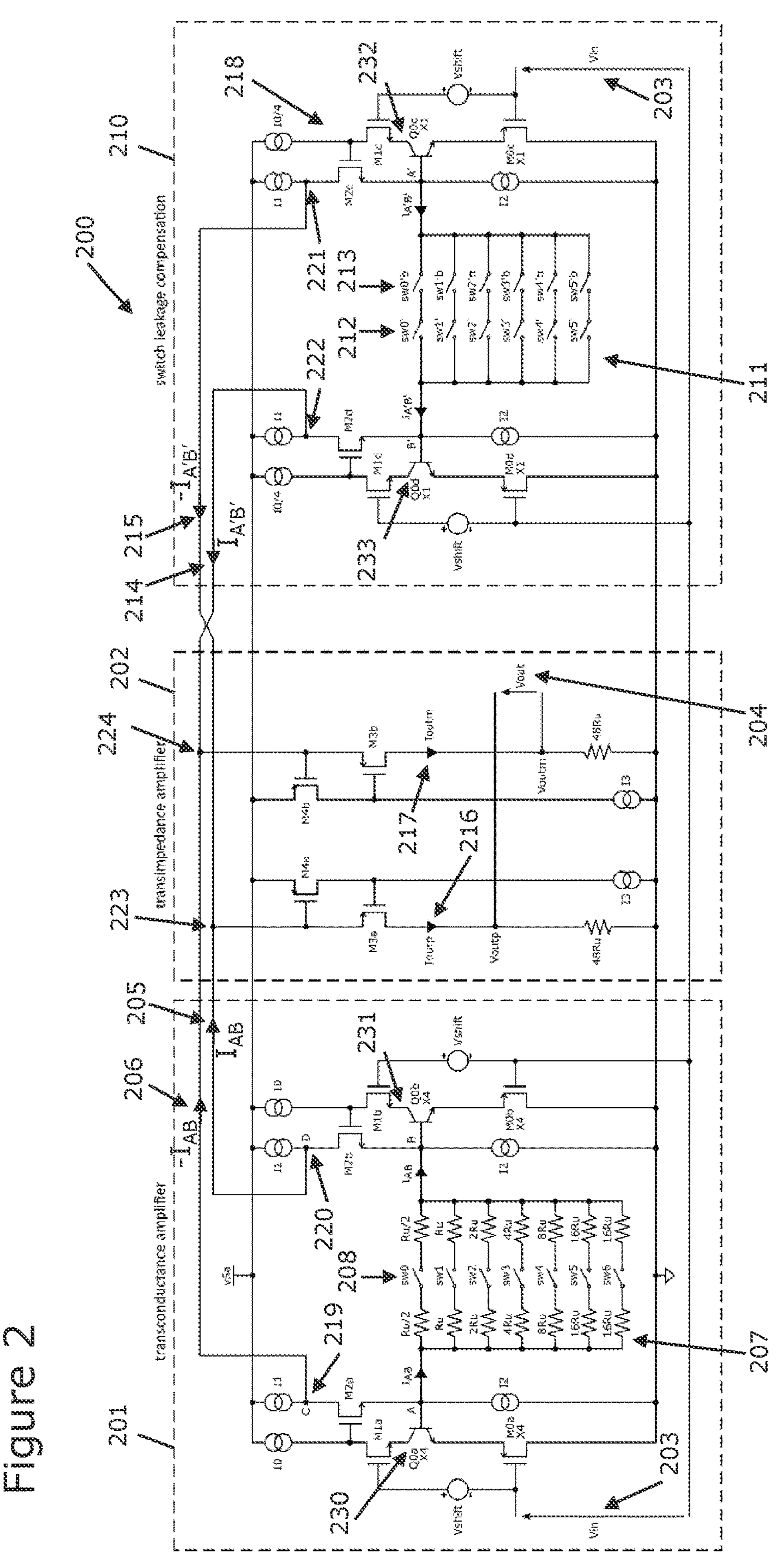
FIG. 2 shows an example embodiment of a PGA according to the present disclosure.

FIG. 2 shows an example embodiment of a PGA 200 according to the present disclosure. Features of the PGA 200 of FIG. 2 that are also shown in FIG. 1 will be given corresponding reference numbers in the 200 series and will not necessarily be described again here.

In addition to the components of FIG. 1, the PGA 200 of FIG. 2 includes a switch leakage compensation circuit 210. The switch leakage compensation circuit 210 receives the input voltage signal 203 and outputs a compensation current signal, in this example a differential compensation current signal ($I_{A'B'}$, $-I_{A'B'}$) 214, 215.

The switch leakage compensation circuit 210 includes a compensation transconductance amplifier 218, and the compensation transconductance amplifier 218 comprises a switchable compensation resistance network 211. The majority of the compensation transconductance amplifier 218 is the same as the transconductance amplifier 201, with the exception of the switchable compensation resistance network 211. In this way, the compensation transconductance amplifier 218 provides bias conditions to the switchable compensation resistance network 211 that are the same as the bias conditions that are provided by the transconductance amplifier 201 to the switchable resistance network 207. With the exception of the switchable compensation resistance network 211, the compensation transconductance amplifier 218 can have the same circuit layout and the same (or substantially similar) component values as the transconductance amplifier 201. Advantageously, the compensation transconductance amplifier 218 and the transconductance amplifier 201 can be implemented on the same integrated circuit (IC) such that any manufacturing tolerances that are present in the transconductance amplifier 201 are likely to be the same in the compensation transconductance amplifier 218.

The switchable compensation resistance network 211 includes a plurality of branches in parallel with each other. Each branch is connected in series between the base of a third transistor (labelled as node A' in FIG. 2) and the base of a fourth transistor (labelled as node B' in FIG. 2). The third transistor 232 and the fourth transistor 233 are provided as part of a level shifter. The third transistor 232 of the switch leakage compensation circuit 210 can be considered as functionally equivalent to the first transistor 230 in the transconductance amplifier 201. The fourth transistor 233 of the switch leakage compensation circuit 210 can be considered as functionally equivalent to the second transistor 231 in the transconductance amplifier 201.

Each branch of the switchable compensation resistance network 211 includes a gain-mimicking switch 212 in series with a leakage-current-conducting switch 213. Each gain-mimicking switch 212 has a corresponding gain-setting switch 208 in the switchable resistance network 207. Each gain-setting switch 208 in the switchable resistance network 207 does not necessarily have a corresponding gain-mimicking switch 212 in the switchable compensation resistance network 211. For instance, in the example of FIG. 2, the switchable resistance network 207 has a seventh branch (with components labelled as 16Ru, sw6, 16RU in FIG. 2) that does not have a corresponding branch in the switchable compensation resistance network 211. This is because the gain-setting switch 208 in the seventh branch of the switchable resistance network 207 in this example is always closed during operation such that a minimum gain value (Av) of 3 is applied (as shown in the above table that illustrates one way in which the gain-setting switches 208 can be controlled to provide a plurality of different gain values). Therefore, there will not be any leakage current through the gain-setting switch 208 in the seventh branch of the switchable resistance network 207 when the PGA 200 is in use. The switchable resistance network 207 can thus have a branch that is always "on" to define a minimum gain value.

Each gain-mimicking switch 212 is openable and closable in accordance with the same switch control signal that is used for the corresponding gain-setting switch 208. Furthermore, the characteristics of the gain-mimicking switches 212 are the same as the characteristics of the corresponding gain-setting switches 208. This can include the gain-mimicking switches 212 and the corresponding gain-setting switches 208 having the same size (especially when they are implemented on silicon). Therefore, the gain-mimicking switches 212 (labelled as swi' in FIG. 2) have the same size and are operated according to the same control signals as the corresponding gain-setting switches 208 (labelled as swi in FIG. 2).

The leakage-current-conducting switches 213 are openable and closable in accordance with the inverse/complement of the switch control signal that is used to control the gain-mimicking switch 212 in the same branch. In this way, when the gain-mimicking switch 212 in the branch is open, the leakage-current-conducting switch 213 in the branch is closed, and vice versa. That is, when the gain-mimicking switch 212 in the branch is closed, the leakage-current-conducting switch 213 in the branch is open.

The leakage-current-conducting switches 213 can be smaller than the gain-mimicking switches 212 (and therefore also smaller than the gain-setting switches 208) such that they contribute only a small amount of leakage current when they are open. In some applications, the leakage-current-conducting switches 213 can have the minimum size that is possible on an IC such that they contribute the minimum amount of leakage current when they are open.

The branches of the switchable compensation resistance network 211 do not include any resistors (or at least no significant resistance beyond the inherent properties of the switches 212, 213) so that the differential compensation current signal ($I_{A'B'}$, $-I_{A'B'}$) 214, 215 that is provided by the switch leakage compensation circuit 210 does not significantly affect the overall gain of the PGA 200.

By including a leakage-current-conducting switch 213 in cascade with each gain-mimicking switch 212, and by operating the leakage-current-conducting switches 213 with complementary commands to those for the associated gain-mimicking switches 212, the same non-linear term that is highlighted in bold above for the transconductance amplifier 201 can be generated. As will be described below, this new term can be added with a negative sign to the differential transconductance amplifier current signals ($I_{AB}$, $-I_{AB}$) 205, 206 from the (original) transconductance amplifier 201.

The transimpedance amplifier 202 has a positive-input-terminal 223 and negative-input-terminal 224. As will be appreciated from the above description, the transimpedance amplifier 202 provides the output voltage signal (Vout) 204 based on differential input current signals $I_{outp}$, $I_{outm}$ 216, 217 received at its positive-input-terminal 223 and negative-input-terminal 224. In this example, the transimpedance amplifier 202 receives the transconductance amplifier current signal ($I_{AB}$ and $-I_{AB}$) 205, 206 and the compensation current signal ($I_{A'B'}$ and $-I_{A'B'}$) 214, 215 such that they have opposite polarities to each other.

The positive-input-terminal 223 of the transimpedance amplifier 202 is connected to a positive-output-terminal 220 of the transconductance amplifier 201, such that it receives a positive differential transconductance amplifier current signal $I_{AB}$ 205 from the transconductance amplifier 201. The negative-input-terminal 224 of the transimpedance amplifier 202 is connected to a negative-output-terminal 219 of the transconductance amplifier 201, such that it receives a negative differential transconductance amplifier current signal $-I_{AB}$ 206 from the transconductance amplifier 201.

The switch leakage compensation circuit 210 also includes a positive-output-terminal 222 and a negative-output-terminal 221. The positive-output-terminal 222 provides a positive differential compensation current signal $I_{A'B'}$ 214. The negative-output-terminal 221 provides a negative differential compensation current signal 215. The positive-input-terminal 223 of the transimpedance amplifier 202 is connected to the negative-output-terminal 221 of the switch leakage compensation circuit 210, such that it receives the negative differential compensation current signal 215 from the switch leakage compensation circuit 210. The negative-input-terminal 224 of the transimpedance amplifier 202 is connected to the positive-output-terminal 222 of the switch leakage compensation circuit 210, such that it receives the positive differential compensation current signal $I_{A'B'}$ 214 from the switch leakage compensation circuit 210. In this way, the transimpedance amplifier 202 can provide the output voltage signal (Vout) 204 based on the difference between the transconductance amplifier current signal ($I_{AB}$ and $-I_{AB}$) 205, 206 from the transconductance amplifier 201 and the compensation current signal ($I_{A'B'}$ and $-I_{A'B'}$) 214, 215 from the switch leakage compensation circuit 210.

The operation of the switch leakage compensation circuit 210 can be represented by the following equation (neglecting the leakage currents of the leakage-current-conducting switches 213, which is acceptable because they are much smaller than the gain-mimicking switches 212):

$$I_{A'B'}=I_{sw0'}\cdot\overline{b_0}+I_{sw1'}\cdot\overline{b_1}+I_{sw2'}\cdot\overline{b_2}+I_{sw3'}\cdot\overline{b_3}+I_{sw4'}\cdot\overline{b_4}+I_{sw5'}\cdot\overline{b_5}$$

Where:

$I_{A'B'}$ is the positive differential compensation current signal 214 that is provided as an output of the switch leakage compensation circuit 210;

$I_{swi'}$ is the leakage current through the $i^{th}$ 212 gain-mimicking switch 212; and $\overline{b}_i$ is the inverse of the switch control signal for setting the state of the corresponding $i^{th}$ gain-setting switch 208.

The positive differential input current signal (Ioutp) 216 for the transimpedance amplifier 202 of FIG. 2 is (with the newly added terms due to the switch leakage compensation circuit 210 shown in bold):

$$I_{outp} = I_{AB} - I_{A'B'} = \frac{V_{in}}{R_u}\cdot b_0 + \frac{V_{in}}{2R_u}\cdot b_1 + \frac{V_{in}}{4R_u}\cdot b_2 + \frac{V_{in}}{8R_u}\cdot b_3 + \frac{V_{in}}{16R_u}\cdot b_4 + \frac{V_{in}}{32R_u}\cdot b_5 + \frac{V_{in}}{32R_u}\cdot b_6 + I_{sw0}\cdot\overline{b_0} + I_{sw1}\cdot\overline{b_1} + I_{sw2}\cdot\overline{b_2} + I_{sw3}\cdot\overline{b_3} + I_{sw4}\cdot\overline{b_4} + I_{sw5}\cdot\overline{b_5} - I_{sw0'}\cdot\overline{b_0} - I_{sw1'}\cdot\overline{b_1} - I_{sw2'}\cdot\overline{b_2} - I_{sw3'}\cdot\overline{b_3} - I_{sw4'}\cdot\overline{b_4} - I_{sw5'}\cdot\overline{b_5}$$

It will be appreciated that similar equations can be written for the negative differential input current signal (Ioutm) 217.

The transfer function (Gm) of a combination of the transconductance amplifier 201 and the switch leakage compensation circuit 210 can be represented as (with the newly added terms due to the switch leakage compensation circuit 210 shown in bold):

$$G_m = \frac{I_{out}}{V_{in}} = \frac{2}{R_u}\cdot b_0 + \frac{1}{R_u}\cdot b_1 + \frac{1}{2R_u}\cdot b_2 + \frac{1}{4R_u}\cdot b_3 + \frac{1}{8R_u}\cdot b_4 + \frac{1}{16R_u}\cdot b_5 + \frac{1}{16R_u}\cdot b_6 +$$

-continued $$\frac{2}{V_{in}}\left(I_{sw0}\cdot\overline{b_0}+I_{sw1}\cdot\overline{b_1}+I_{sw2}\cdot\overline{b_2}+I_{sw3}\cdot\overline{b_3}+I_{sw4}\cdot\overline{b_4}+I_{sw5}\cdot\overline{b_5}\right)-\frac{2}{V_{in}}\left(I_{sw0'}\cdot\overline{b_0}+I_{sw1'}\cdot\overline{b_1}+I_{sw2'}\cdot\overline{b_2}+I_{sw3'}\cdot\overline{b_3}+I_{sw4'}\cdot\overline{b_4}+I_{sw5'}\cdot\overline{b_5}\right)$$

This equation can be rewritten to highlight an important part of the expression:

$$G_m=\frac{2}{R_u}\cdot b_0+\frac{1}{R_u}\cdot b_1+\frac{1}{2R_u}\cdot b_2+\frac{1}{4R_u}\cdot b_3+\frac{1}{8R_u}\cdot b_4+\frac{1}{16R_u}\cdot b_5+\frac{1}{16R_u}\cdot b_6$$
$$\boxed{+\frac{2}{V_{in}}\left[(I_{sw0}-I_{sw0'})\overline{b_0}+(I_{sw1}-I_{sw1'})\overline{b_1}+(I_{sw2}-I_{sw2})\overline{b_2}+(I_{sw3}-I_{sw3'})\overline{b_3}+(I_{sw4}-I_{sw4'})\overline{b_4}+\left(I_{sw5}-I_{sw5'}\overline{b_5}\right)\right]}$$

In this equation, we can remove the term in the box if $I_{swi}=I_{swi'}$. This is because the term in the box will equal zero. This condition is true at the first order (neglecting any mismatch between the switches, which is assumed to be negligible) because the gain-setting switches 208 (swi) and the gain-mimicking switches 212 (swi') are identical (in terms of type of component and size) and they are biased in the same way.

Even if mismatch between the switches is not neglected, the term of the expression that is shown in the box will be greatly reduced such that it is not problematic for the performance of the PGA 200.

The transfer function of the PGA can be written as:

$$A_V=\frac{V_{out}}{V_{in}}=96\cdot b_0+48\cdot b_1+24\cdot b_2+12\cdot b_3+6\cdot b_4+3\cdot b_5+3\cdot b_6+\frac{96R_u}{V_{in}}\left[(I_{sw0}-I_{sw0'})\overline{b_0}+(I_{sw1}-I_{sw1'})\overline{b_1}+(I_{sw2}-I_{sw2})\overline{b_2}+(I_{sw3}-I_{sw3'})\overline{b_3}+(I_{sw4}-I_{sw4'})\overline{b_4}+(I_{sw5}-I_{sw5'})\overline{b_5}\right]$$

Assuming that there is no mismatch, this previous expression can be simplified to:

$$A_V=\frac{V_{out}}{V_{in}}=96\cdot b_0+48\cdot b_1+24\cdot b_2+12\cdot b_3+6\cdot b_4+3\cdot b_5+3\cdot b_6$$

Therefore, it can be seen that the use of the switch leakage compensation circuit 210 removes the non-linearity in the transfer function that was identified above for the PGA of FIG. 1. This is because the transfer function no longer depends on Vin. Furthermore, the leakage currents through the open gain-setting switches 208 are cancelled out by corresponding leakage currents through the open gain-mimicking switches 212. The switch leakage compensation circuit 210 that has been added to the PGA architecture enables a gain value to be achieved that converges on the ideal gain Av that is identified earlier in this document. As a reminder, that ideal gain had been determined by considering ideal switches.

We will now describe some simulation results for the PGA of FIG. 2, implemented on silicon.

Figure 3:
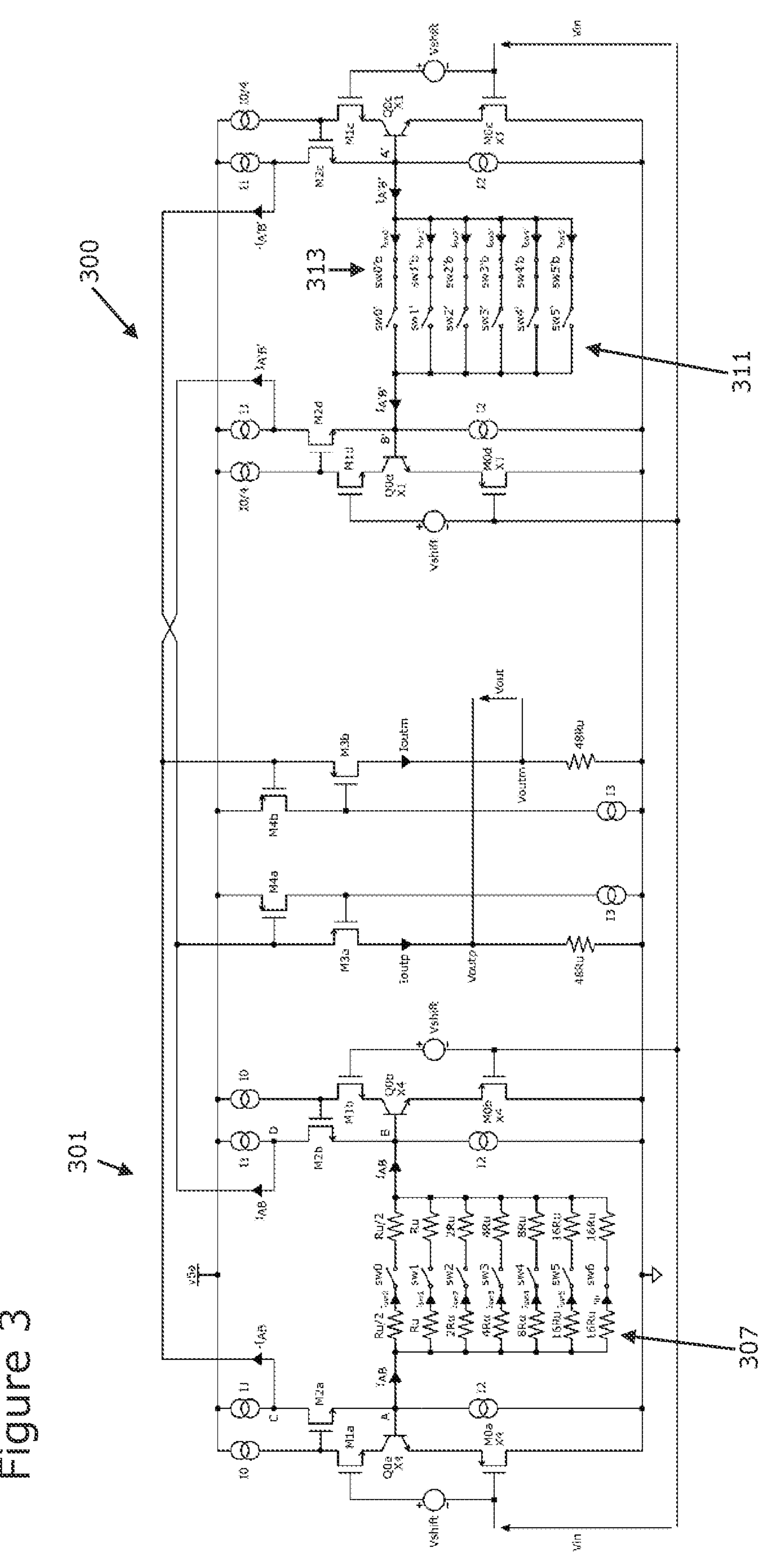
FIG. 3 illustrates the PGA of FIG. 2 configured to apply a gain value of 3.

FIG. 3 illustrates the PGA of FIG. 2 configured to apply a gain value of 3 (Av=3) by closing only the gain-setting switch in the seventh branch of the switchable resistance network 307 in the transconductance amplifier 301. This represents the minimum gain value that can be applied by the PGA 300. Applying such a minimum gain value can be considered as the worst-case scenario in terms of leakage current through the gain-setting switches. This is because only one gain-setting switch is closed and the rest are open. Correspondingly, all of the leakage-current-conducting switches 313 are closed.

Figure 4:
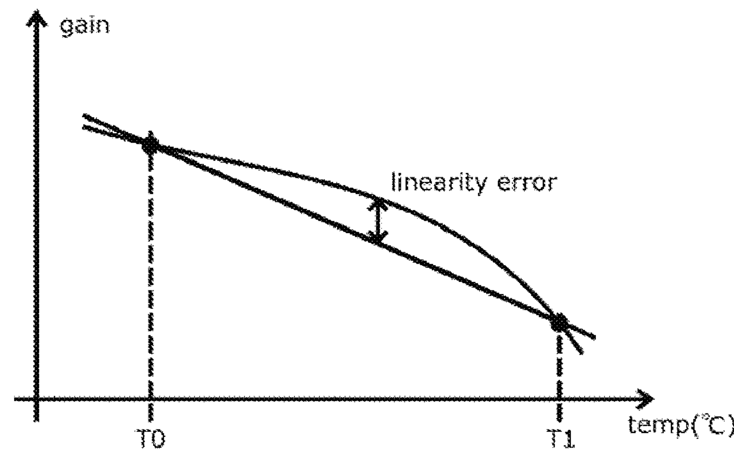
FIG. 4 illustrates the principle of a measure of the linearity of the gain with respect to the input signal and temperature.

For this kind of block, the linearity of the gain with respect to the input signal and temperature can be a very important specification. In the following simulations, we focus on the gain linearity with respect to the temperature. The linearity error is calculated with respect to an extrapolated gain obtained by two measures at temperature T0 and T1. FIG. 4 illustrates the principle of this measure.

Figure 5A:
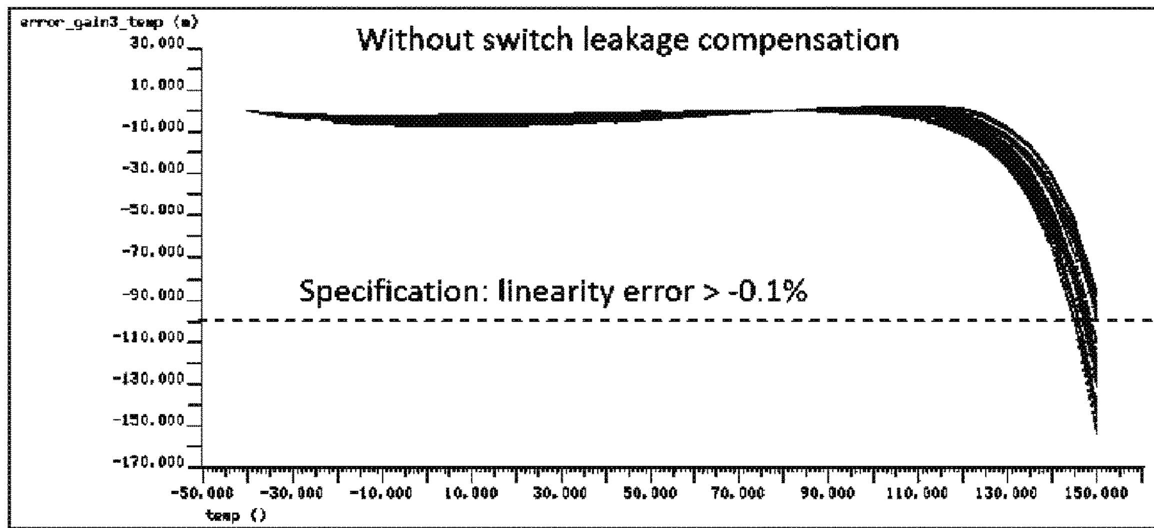
FIG. 5*a* shows a plot of gain error versus temperature for the PGA of FIG. 1 that is configured to apply a gain factor of 3.
Figure 5B:
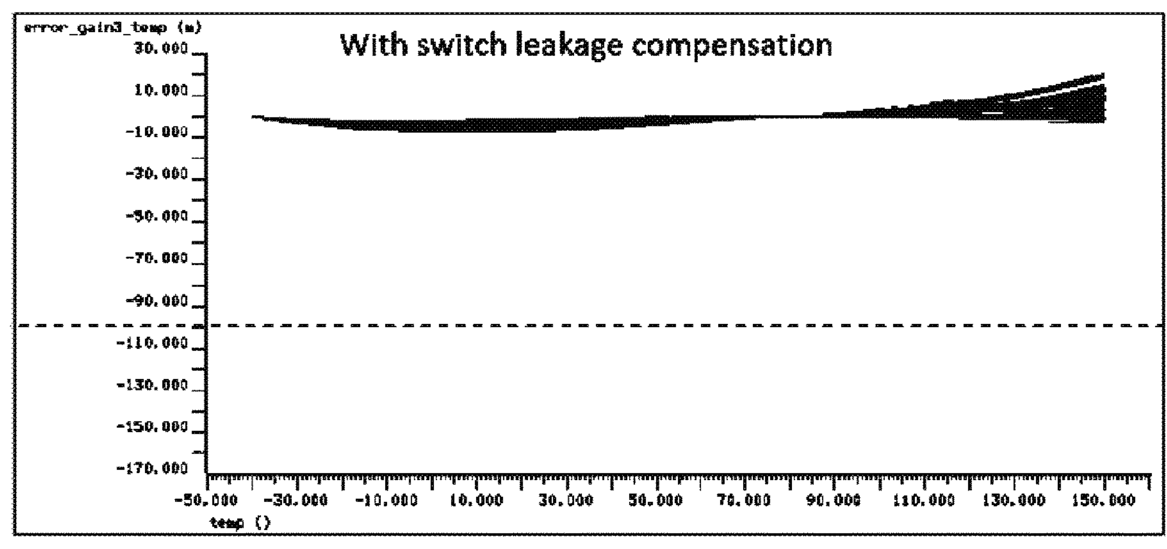
FIG. 5*b* shows a plot of gain error versus temperature for the PGA of FIG. 3 that is configured to apply a gain factor of 3.

FIG. 5*a* shows a plot of gain error (in milli-percent) on the horizontal axis versus temperature on the vertical axis, for several process cases, for the PGA of FIG. 1 (i.e. one without switch leakage compensation) that is configured to apply a gain factor of 3 (Av=3). FIG. 5*b* shows a plot of gain error (in milli-percent) on the horizontal axis versus temperature on the vertical axis, for several process cases, for the PGA of FIG. 3 (i.e. one with switch leakage compensation) that is configured to apply a gain factor of 3 (Av=3).

The table below compares results of both of the PGA architectures that are illustrated in FIGS. 5*a* and 5*b*.

| Linearity error (%) | Without leakage compensation | With leakage compensation |
|---|---|---|
| min | −154 m | −7.2 m |
| max | 3.2 m | 21 m |

It can be seen that the new PGA architecture (with the switch leakage compensation circuit of FIG. 3) achieves an improvement in linearity by a factor of about 7 when the PGA 600 applies a gain value of 3.

Figure 6:
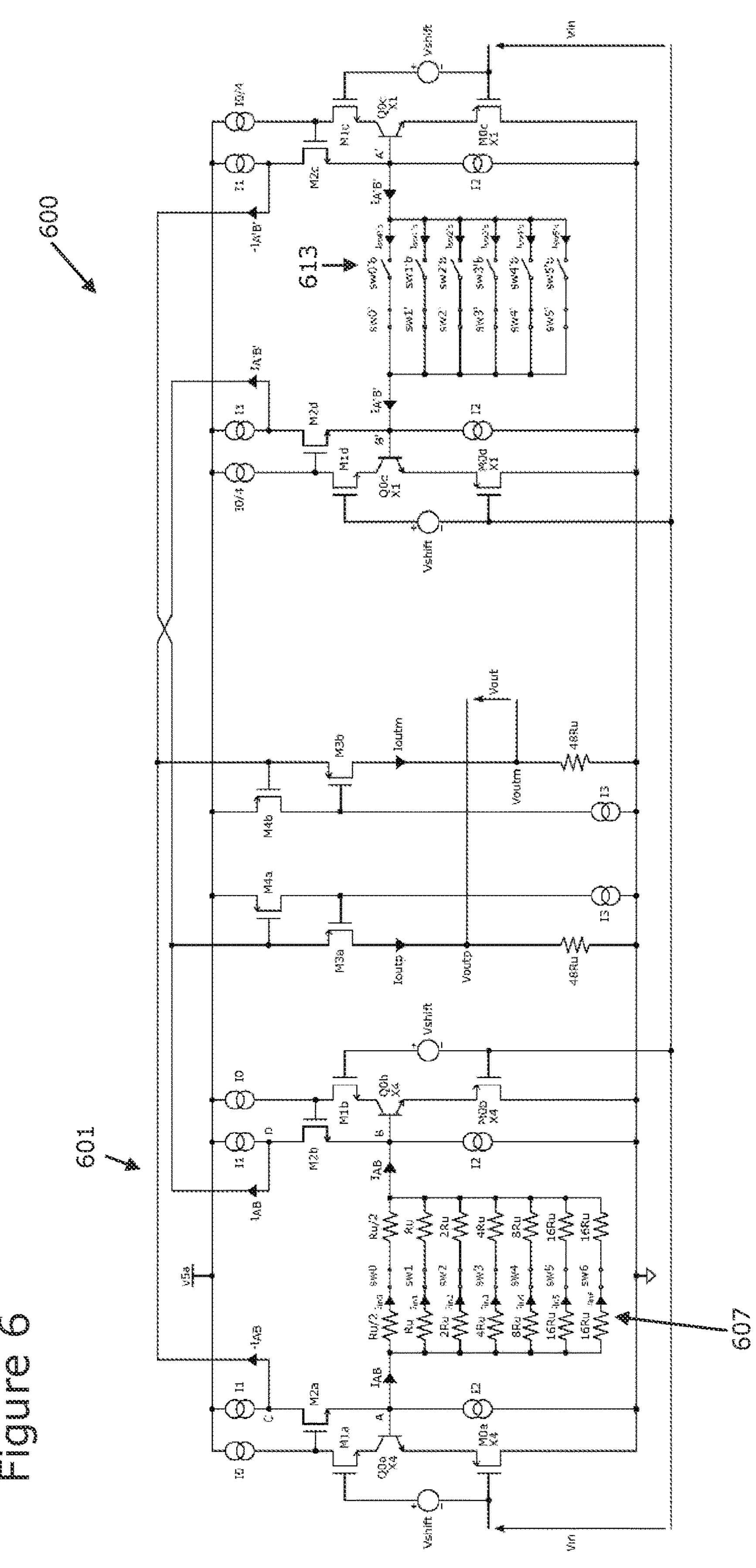
FIG. 6 illustrates the PGA of FIG. 2 configured to apply a gain value of 192.

FIG. 6 illustrates the PGA of FIG. 2 configured to apply a gain value of 192 (Av=192) by closing all of the gain-setting switches in the switchable resistance network 607 in the transconductance amplifier 601. This represents the maximum gain value that can be applied by the PGA 600. Applying such a maximum gain value should not result in any leakage current through the gain-setting switches because they are all closed. Correspondingly, all of the leakage-current-conducting switches 613 are open. The PGA 600 of FIG. 6 is simulated to ensure that the inclusion of the switch leakage compensation circuit does not negatively affect the performance of the PGA 600 when it is not required.

Figure 7A:
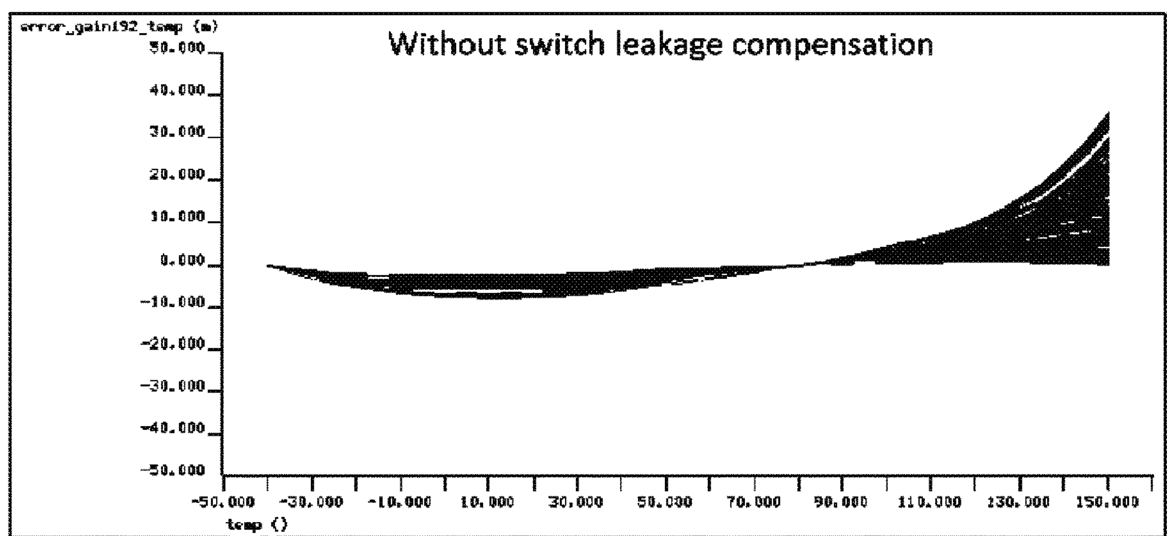
FIG. 7*a* shows a plot of gain error versus temperature for the PGA of FIG. 1 that is configured to apply a gain factor of 192.
Figure 7B:
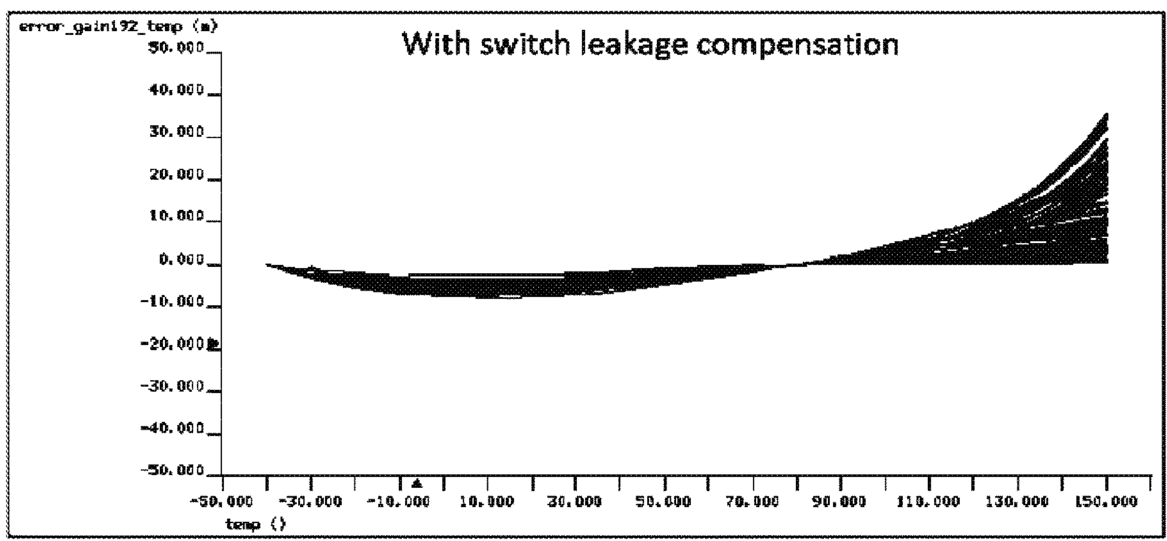
FIG. 7*b* shows a plot of gain error versus temperature for the PGA of FIG. 6 that is configured to apply a gain factor of 192.

FIG. 7*a* shows a plot of gain error (in milli-percent) on the horizontal axis versus temperature on the vertical axis, for several process cases, for the PGA of FIG. 1 (i.e. one without switch leakage compensation) that is configured to apply a gain factor of 192 (Av=192). FIG. 7*b* shows a plot of gain error (in milli-percent) on the horizontal axis versus temperature on the vertical axis, for several process cases, for the PGA of FIG. 6 (i.e. one with switch leakage compensation) that is configured to apply a gain factor of 192 (Av=192).

The table below compares results of both of the PGA architectures that are illustrated in FIGS. 7*a* and 7*b*.

| Linearity error (%) | Without leakage compensation | With leakage compensation |
|---|---|---|
| min | −7.86 m | −7.86 m |
| max | 35.98 m | 36 m |

It can be seen that the linearity error is the same when applying a gain value of 192, both with and without the switch leakage compensation circuit. Therefore, even when the switch leakage compensation circuit is not required, it does not perturb the performance of the original architecture.

Embodiments of PGAs described herein can be beneficial when used as part of a High linearity Programmable Gain Amplifier or a High linearity Variable Gain Amplifier (VGA), for example.

Furthermore, embodiments of PGAs described herein can be used in any measurement chain for monitoring a voltage or a current. In one application, the PGA can be used to monitor current in a battery of an electrical vehicle. Such PGAs can also be associated with an analogue to digital converter (ADC) in a BMS (Battery Management System).

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A programmable gain amplifier that is configured to receive an input voltage signal and provide an output voltage signal, wherein the programmable gain amplifier comprises:

a transconductance amplifier, which is configured to receive the input voltage signal and provide a transconductance amplifier current signal, wherein the transconductance amplifier comprises a switchable resistance network that is configurable to set the gain of the programmable gain amplifier;

a switch leakage compensation circuit, which is configured to receive the input voltage signal and output a compensation current signal, wherein the switch leakage compensation circuit comprises a compensation transconductance amplifier, and wherein the compensation transconductance amplifier comprises a switchable compensation resistance network;

a transimpedance amplifier, which is configured to provide the output voltage signal based on the difference between the transconductance amplifier current signal from the transconductance amplifier and the compensation current signal from the switch leakage compensation circuit;

wherein:

the switchable resistance network comprises a plurality of branches in parallel with each other, wherein each branch includes:

a gain-setting switch that is openable and closable in accordance with a switch control signal to influence the gain of the programmable gain amplifier; and a resistance in series with the gain-setting switch;

the switchable compensation resistance network comprises a plurality of branches in parallel with each other, wherein each branch includes:

a gain-mimicking switch that has a corresponding gain-setting switch in the switchable resistance network, wherein the gain-mimicking switch is openable and closable in accordance with the same switch control signal that is used for the corresponding gain-setting switch; and a leakage-current-conducting switch in series with the gain-mimicking switch, wherein the leakage-current-conducting switch is openable and closable in accordance with the complement of the switch control signal that is used to control the gain-mimicking switch in the same branch such that when the gain-mimicking switch in the branch is open, the leakage-current-conducting switch in the branch is closed, and vice versa.

2. The programmable gain amplifier of claim 1, wherein the gain-mimicking switches are configured to operate on the same bias conditions as their corresponding gain-setting switches.

3. The programmable gain amplifier of claim 1, wherein each gain-mimicking switch is the same size as its corresponding gain-setting switch.

4. The programmable gain amplifier of claim 1, wherein the transimpedance amplifier is configured to receive the transconductance amplifier current signal and the compensation current signal such that they have opposite polarities to each other.

5. The programmable gain amplifier of claim 1, wherein:
the transconductance amplifier current signal is a differential signal that comprises: a positive differential transconductance amplifier current signal; and a negative differential transconductance amplifier current signal.

6. The programmable gain amplifier of claim 1, wherein the leakage-current-conducting-switches are smaller than the gain-mimicking switches.

7. The programmable gain amplifier of claim 1, wherein the branches of the switchable compensation resistance network do not include any resistors.

8. The programmable gain amplifier of claim 1, wherein a plurality of the branches in the switchable compensation resistance network comprise resistances with different resistance values.

9. The programmable gain amplifier of claim 1, wherein the compensation transconductance amplifier is the same as the transconductance amplifier, with the exception of the switchable resistance network and the switchable compensation resistance network.

10. The programmable gain amplifier of claim 1, wherein the circuit layout of the compensation transconductance amplifier is the same as the circuit layout of the transconductance amplifier.

11. The programmable gain amplifier of claim 1, wherein, with the exception of the switchable resistance network and the switchable compensation resistance network, the component values of components in the compensation transconductance amplifier are the same as component values of corresponding components in the transconductance amplifier.

12. The programmable gain amplifier of claim 1, wherein the switchable resistance network has a branch in which the gain-setting switch is always closed when the programmable gain array is in use in order to apply a minimum gain value.

13. The programmable gain amplifier of claim 1, wherein the switchable resistance network has a branch that does not have a corresponding branch in the switchable compensation resistance network.

14. The programmable gain amplifier of claim 1, further comprising a controller, wherein the controller is configured to provide switch control signals for operating the gain-setting switches, the gain-mimicking switches and the leakage-current-conducting switches such that the PGA applies a required gain value.

15. An integrated circuit comprising the programmable gain amplifier of claim 1.

16. The programmable gain amplifier of claim 5 wherein:
the compensation current signal is a differential signal that comprises: a positive differential compensation current signal; and a negative differential compensation current signal.

17. The programmable gain amplifier of claim 16 wherein:
the transimpedance amplifier comprises a positive-input-terminal and a negative-input-terminal;
the transconductance amplifier comprises:
a positive-output-terminal, which is configured to provide the positive differential transconductance amplifier current signal; and
a negative-output-terminal, which is configured to provide the negative differential transconductance amplifier current signal;
the switch leakage compensation circuit comprises:
a positive-output-terminal, which is configured to provide the positive differential compensation current signal; and
a negative-output-terminal, which is configured to provide the negative differential compensation current signal;
the positive-input-terminal of the transimpedance amplifier is connected to the positive-output-terminal of the transconductance amplifier;
the positive-input-terminal of the transimpedance amplifier is connected to the negative-output-terminal of the switch leakage compensation circuit;
the negative-input-terminal of the transimpedance amplifier is connected to the negative-output-terminal of the transconductance amplifier; and
the negative-input-terminal of the transimpedance amplifier is connected to the positive-output-terminal of the switch leakage compensation circuit.

18. The programmable gain amplifier of claim 2, wherein each gain-mimicking switch is the same size as its corresponding gain-setting switch.

19. The programmable gain amplifier of claim 2, wherein the transimpedance amplifier is configured to receive the transconductance amplifier current signal and the compensation current signal such that they have opposite polarities to each other.

20. The programmable gain amplifier of claim 5, wherein the leakage-current-conducting-switches are smaller than the gain-mimicking switches.

* * * * *